United States Patent
Peterle et al.

(10) Patent No.: US 9,574,794 B2
(45) Date of Patent: Feb. 21, 2017

(54) RADIATOR, IN PARTICULAR FOR ROOM HEATING

(75) Inventors: Michele Peterle, Mareno di Piave (IT); Marco Argenton, Cinto Caomaggiore (IT)

(73) Assignee: I.R.C.A. S.P.A. INDUSTRIA RESISTENZE CORAZZATE E AFFINI, San Vendemiano (IT)

( * ) Notice: Subject to any disclaimer, the term of this patent is extended or adjusted under 35 U.S.C. 154(b) by 678 days.

(21) Appl. No.: 13/255,309

(22) PCT Filed: Mar. 10, 2010

(86) PCT No.: PCT/IB2010/051030
§ 371 (c)(1),
(2), (4) Date: Sep. 8, 2011

(87) PCT Pub. No.: WO2010/103468
PCT Pub. Date: Sep. 16, 2010

(65) Prior Publication Data
US 2012/0111546 A1    May 10, 2012

(30) Foreign Application Priority Data
Mar. 10, 2009   (IT) .............................. RM2009A0106

(51) Int. Cl.
*F24H 9/20*    (2006.01)
*H05K 7/20*    (2006.01)
(Continued)

(52) U.S. Cl.
CPC ........ *F24H 9/2071* (2013.01); *H05K 7/20409* (2013.01); *F24D 19/0209* (2013.01); *F24D 19/0216* (2013.01); *H05B 1/0277* (2013.01)

(58) Field of Classification Search
CPC .... F24H 9/2071; F24H 9/2064; F24H 9/2078; F24H 9/2085; F24H 9/2092; F24D 19/02; F24D 19/0216; F24D 19/0209; H05B 1/0277; H01L 23/467; H05K 7/20409
(Continued)

(56) References Cited

U.S. PATENT DOCUMENTS 1,927,991 A * 9/1933 Pendleton ........................ 165/57
2,911,512 A * 11/1959 Williams, Jr. ................ 219/213
(Continued)

FOREIGN PATENT DOCUMENTS

EP     0 080 428     6/1983
EP     1 599 080     11/2006
(Continued)

*Primary Examiner* — Len Tran
*Assistant Examiner* — Hans Weiland
(74) *Attorney, Agent, or Firm* — Davis, Malm & D'Agostine, P.C.

(57) ABSTRACT

A radiator in particular for room heating, comprising a control or measurement unit accommodated in a container integral with the radiator and positioned so as to sustain the heat from the radiator as little as possible, while exploiting a cool air flow drawn by the same to cool the internal circuitry defining the unit. Said container is conveniently spaced apart from the radiator by means of insulating elements and a part of the same container is formed by a heat dissipator to which one or more electronic power elements included in said circuitry are thermally connected.

9 Claims, 6 Drawing Sheets

(51) Int. Cl.
*F24D 19/02* (2006.01)
*H05B 1/02* (2006.01)

(58) Field of Classification Search
USPC .......... 165/67, 128, 138; 392/370, 371, 377,
392/378, 436, 437; 248/232; 180/68.4
See application file for complete search history.

(56) References Cited

U.S. PATENT DOCUMENTS

| | | | | |
|---|---|---|---|---|
| 3,538,307 | A * | 11/1970 | Birdwell | 392/377 |
| 4,392,048 | A * | 7/1983 | Carter | F24H 3/002 |
| | | | | 165/128 |
| 4,873,421 | A * | 10/1989 | Brehmer et al. | 392/378 |
| 5,138,134 | A * | 8/1992 | Ellison | 392/448 |
| 5,734,149 | A * | 3/1998 | Skutt | F27B 17/02 |
| | | | | 219/390 |
| 6,619,952 | B2 * | 9/2003 | Hohenshelt et al. | 432/76 |
| 2007/0209372 | A1 * | 9/2007 | Mazzocco et al. | 62/67 |
| 2008/0291627 | A1 | 11/2008 | Fischer | |

FOREIGN PATENT DOCUMENTS

| | | | | | |
|---|---|---|---|---|---|
| GB | | 2297828 A | * | 8/1996 | ............ F24D 19/02 |
| WO | WO 03/100326 | | | 12/2003 | |
| WO | WO 03100326 A1 | | * | 12/2003 | ............... F24H 9/20 |

* cited by examiner

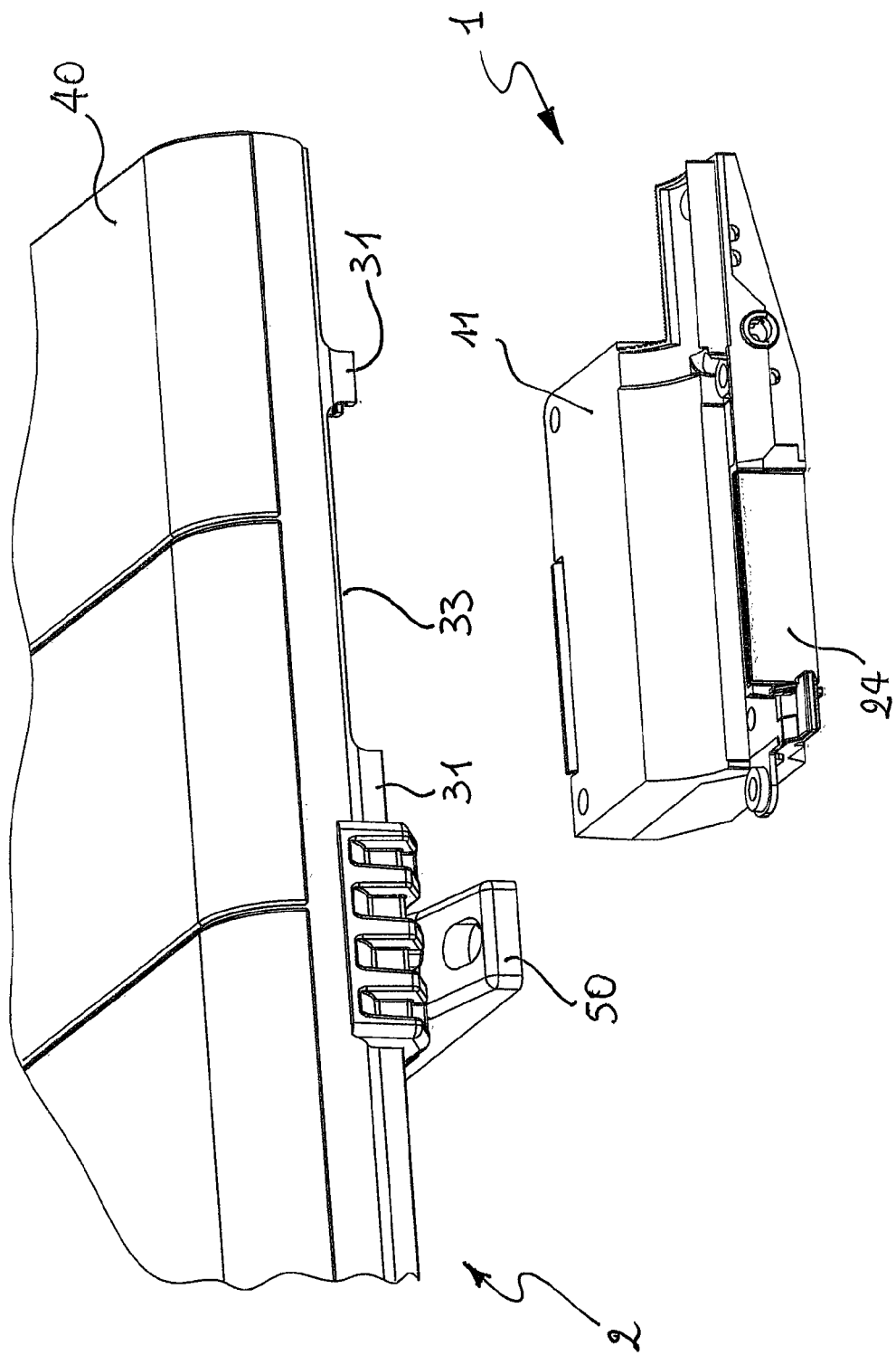

RADIATOR, IN PARTICULAR FOR ROOM HEATING

FIELD OF THE INVENTION

The present invention relates to a radiator, in particular for room heating.

STATE OF THE ART

Radiators comprising a control unit for controlling room parameters and operating parameters of the radiators themselves are known.

Installing the related electronic control units close to the radiator is particularly difficult in fixed radiators (i.e. wall-mounted), the limitation of their heating being required.

Such a problem is more apparent in electric radiators controlled by a complex unit, i.e. capable of adjusting the temperature of the related radiator in relation to local or remote parameters, with particular reference to the power section of the unit, i.e. that in control of adjusting the circulating current in a coil.

It is preferred that the unit be integral with the related radiator to be controlled, due to reasons of installation simplicity, but it is preferred that such a unit be separated for technical reasons so as not to compromise the operation thereof due to the heat radiated from the radiator.

SUMMARY OF THE INVENTION

It is the object of the present invention to provide a radiator, in particular for room heating, adapted to solve the aforesaid problem.

It is the object of the present invention a radiator, in particular for room heating, which, in accordance with claim 1, has a first radiating surface and a second radiating surface, opposite to the first surface, and is configured to be fixed to a support structure and wherein, when the radiator is fixed to the support structure, it defines a high area and a low area of the radiator, and the second radiating surface is facing towards the support structure and defines a rear surface of the radiator, the radiator comprising a container integrally fixed in the low area of the radiator and having a first wall proximal to the radiator and a second wall distal from the radiator and a control or measurement unit, accommodated in the container, characterized in that said container is arranged with its proximal wall facing towards the second radiating surface of the radiator and appropriately spaced apart from said second radiating surface so as to form a passage for an ascending air flow generated by the operation of the radiator, which brushes the container.

Such a solution is better employed when said container is at least partially formed by a heat dissipator adapted to disperse the heat generated by the internal circuitry defining the control unit. Furthermore, it is better applied when the container is associated with the radiator by means of insulating elements, so as to limit the conduction of the heat from the radiator to the container.

The convective motions triggered by the radiator may be advantageously exploited in order to cool the container in which the control unit of the same radiator is accommodated.

The dependent claims describe preferred embodiments of the invention, thus forming an integral part of the present invention.

BRIEF DESCRIPTION OF THE DRAWINGS

Further features and advantages of the invention will become more apparent in light of the detailed description of preferred but not exclusive embodiments of a radiator, in particular for room heating, disclosed by way of non-limiting example, with the aid of the accompanying drawings in which:

FIG. 2 shows a perspective bottom view with respect to the previous figure;

The same reference numerals and letters in the figures identify the same elements or components.

DETAILED DESCRIPTION OF THE PREFERRED EMBODIMENTS OF THE INVENTION

Figure 1:
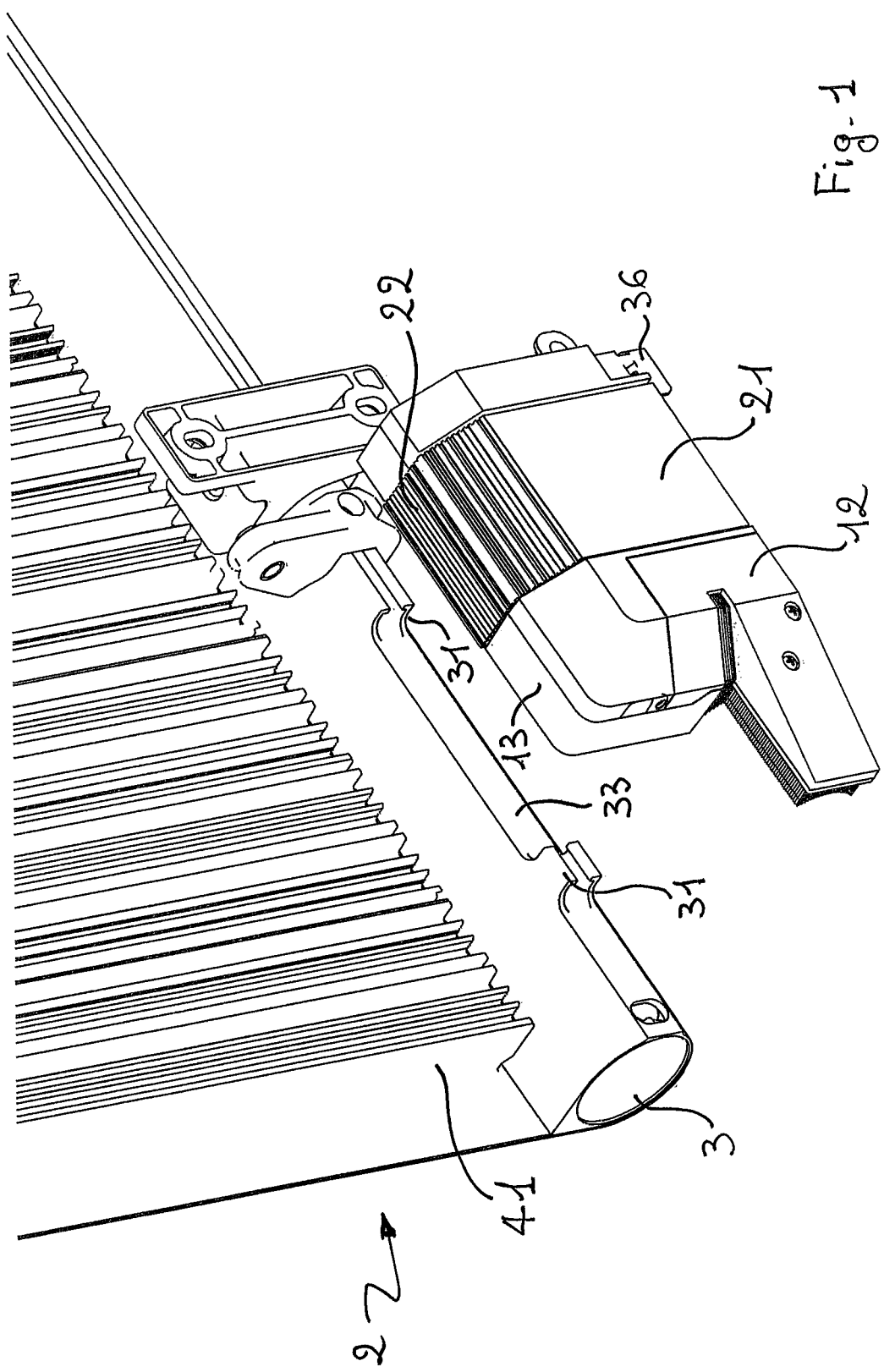
FIG. 1 shows a rear perspective view of a radiator and a control unit container of the radiator, detached from the radiator.

In accordance with the present invention, a radiator 2 comprises a control unit accommodated in a container 1 arranged behind the radiator, i.e. in a position out of sight. In other words, container 1 is between radiator 2 and a support structure, in particular a support wall of the radiator, when it is wall-mounted. In particular, substantially being as a rectangular parallelepiped in shape, radiator 1 comprises a first front face or radiating surface 40 and a second rear face or radiating surface 41, opposite to the first front face 40, usually having larger superficial extensions as compared to other faces of said parallelepiped. The second front face 41 is the face of the radiator facing the support wall of the radiator itself when the latter is fixed on said wall. Instead, the first front face 40 is the face with the largest extension which will be facing the room where the radiator is installed.

A unit container 1, in accordance with the present invention, comprises a plastic casing and a metal heat dissipator 20 which at least partially form said casing.

A preferred heat dissipator is obtained by extrusion and allows the heat, generated by one or more electronic components accommodated in the container, to be externally dissipated. Container 1 is substantially flattened in shape so as to reduce the volume during the installation.

As the heat dissipator 20 is made of aluminium alloy, thus indifferently obtained by extrusion, melting or moulding, it may possibly be anodized in an effective manner, which process confers particular advantages in this specific case, including:

producing a dirt repellent surface which meets hygiene requirements, this helps in keeping the circulating air clean; and conferring an insulating coating to the surfaces from an electrical point of view, which contributes to the electrical safety of the product, thus also helping the thermal dissipation by radiation.

It is therefore preferred to obtain the heat dissipator by extrusion as its alloy may be easily anodized due to the chemical composition, e.g. with a low silicon content that is typical of foundry alloys.

Figure 3A:
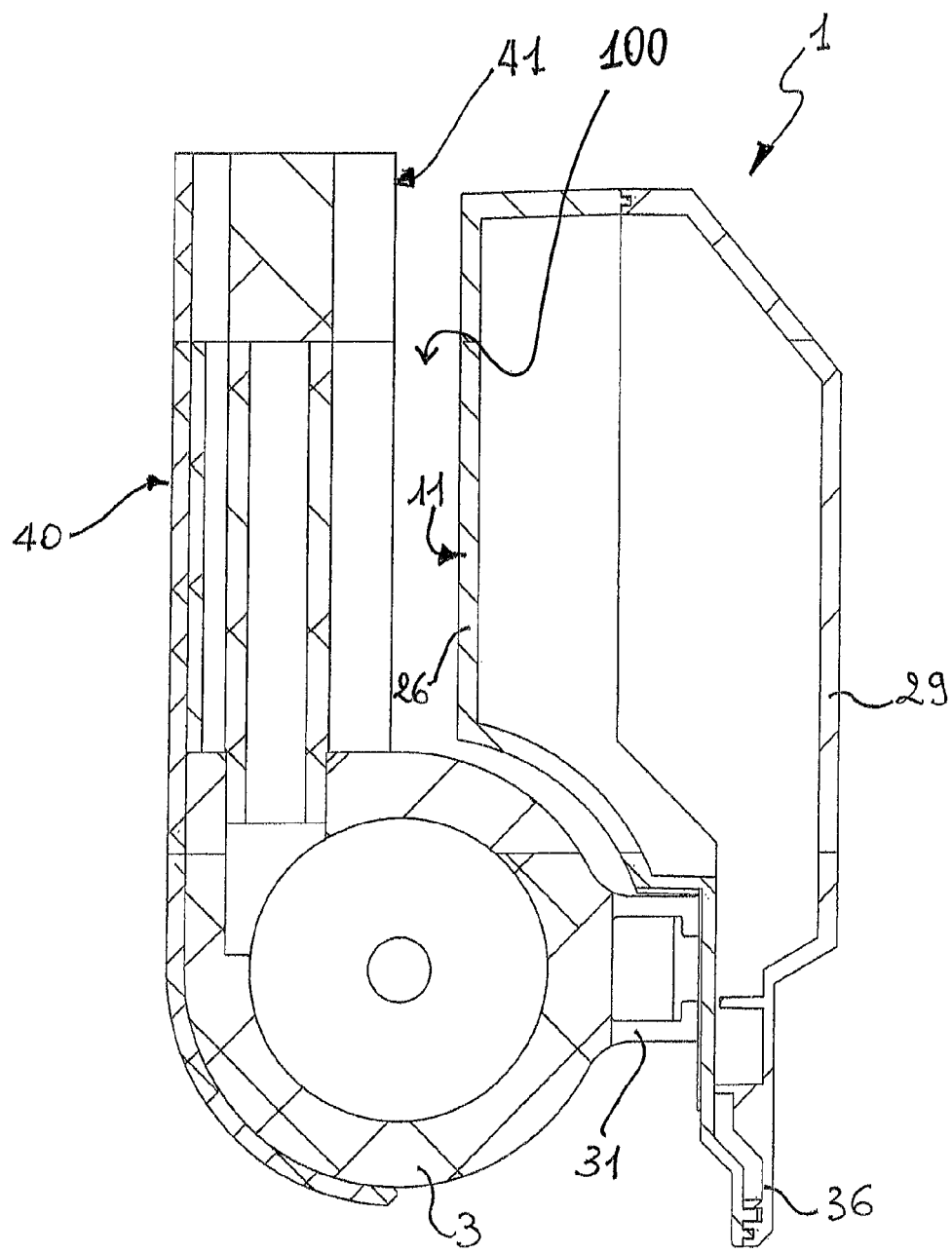
FIGS. 3a and 3b show cross sections on two different parallel planes of the unit container shown in the previous figures.

As shown in FIGS. 1 and 3, container 1 is configured so as to be associated with radiator 2 in a low part thereof, thus limiting the contact points with the same and appropriately insulating the contact points therewith. The heat dissipator 20 and therefore the container 1 are placed in the low part of radiator 2 and close to the wall or support structure, and, as mentioned, it is continuously brushed by the air recirculated by the convective motions triggered by the radiator itself.

For this reason the face 11 of container 1, intended to face towards radiator 2, is made of plastic material, while the face 12 opposite to face 11 is at least partially formed by a heat dissipator 20 of structural element and heat dissipation element. It is preferred that the part 21 of the heat dissipator 20 which contributes in forming the face 12 is smooth so as to facilitate the ascent by natural convection of the cool air upwards.

Also, it is preferred that the part 22 of the heat dissipator 20 which contributes in forming the upper face 13 of container 1 is appropriately finned to better disperse the heat. More specifically, it is preferred that the heat dissipator 20 is C-shaped, so as to at least partially cover or replace three sides of the container. Indeed, the lower side 24 of the heat dissipator 20 is seen in FIG. 3.

A housing 36 is provided in the low area of container 1 for a possible temperature sensor in such a position as to be least disturbed by the heat radiated from the surfaces of radiator 2.

According to a preferred embodiment of container 1 and heat dissipator 20, the part of the container made of insulating material makes a closed housing per se, comprising an opening 14 adapted to be engaged by an extension 23 of the heat dissipator 20 with which the electronic elements requiring greater heat dissipation are associated.

According to another aspect of the invention, a radiator 2 comprises a manifold 3 in its low part, provided with a longitudinal groove 31. Said longitudinal groove 31, e.g. of the slide type, preferably having a C-shaped profile section, is used to fix the support elements of the radiator 2, such as clamping brackets, to the support wall and, as seen in FIGS. 1 and 2, it is conveniently milled in an area 33 of manifold 3 so as to define a longitudinal area without the same longitudinal groove 31, in order to promote the passage of cooler air to be heated, drawn from below by the convective motions through passage 100 (FIGS. 3a, 3b), which are triggered when the radiator is operating, diagrammatically indicated by arrow F, in said interruption area of the groove 31 between container 1 and radiator 2. A "chimney effect" is advantageously generated in this interruption area due to the larger air passage section, followed by a narrower passage section between the container 1 and the radiator 2.

A manifold 3 provided with the groove 31 may be advantageously obtained by extrusion and then milled in the area 33 intended to mount the container 1 of the control unit. An element is inserted into the longitudinal groove 31, said element at least comprising a threaded hole which may be intercepted from the outside, so that the container 1 firmly remains associated with manifold 3 by tightening a pin in such a hole.

Figure 4:
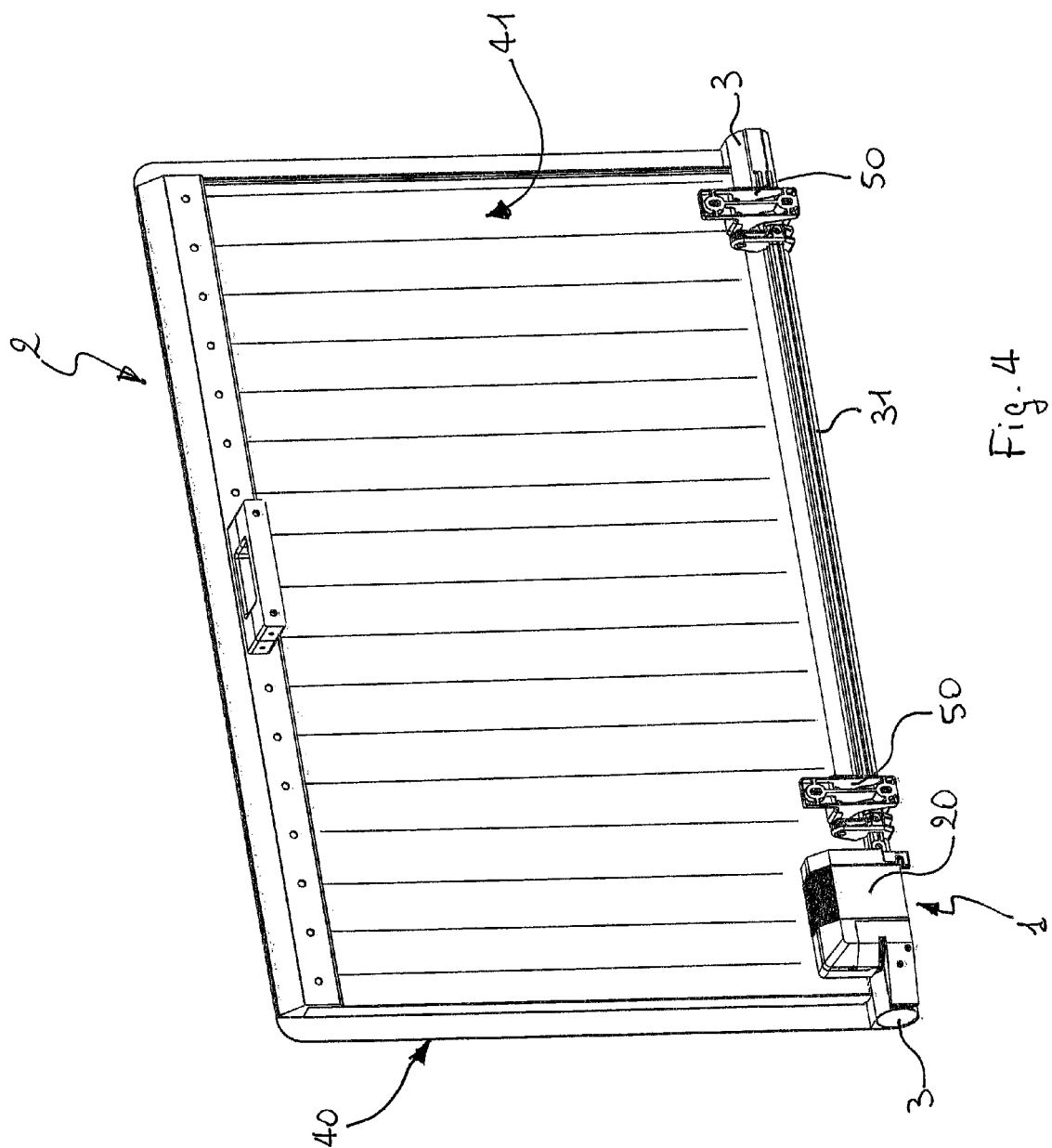
FIG. 4 shows a rear perspective view corresponding to FIG. 1, in which the unit container is attached to the related radiator.

In a first preferred variant, shown in FIG. 1 and FIG. 4, the area 33 is provided at one end of the manifold 3 of radiator 2, preferably between a terminal end of manifold 3 and the fixing area of a support element 50 of radiator 2.

In a further variant (not shown), the area 33 may be provided between the fixing areas of the support elements 50 of radiator 2.

Figure 3B:
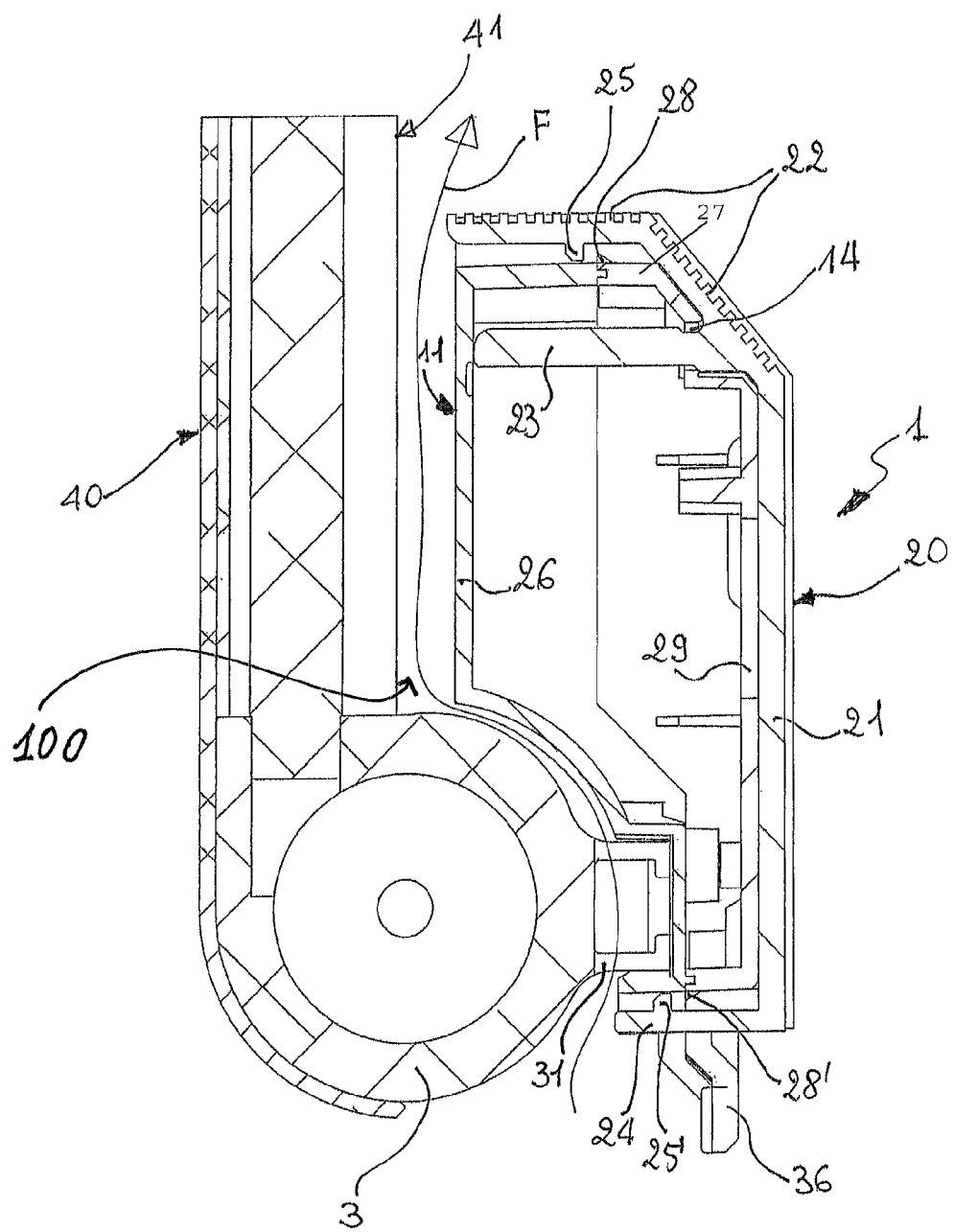

As shown in FIG. 3b, the container part made of insulating material may be divided into two or more bodies 26, 27, 29 and the heat dissipator 20 is shaped to allow the container to be opened, e.g. by means of the protrusions 25, 25' which permit both to engage and disengage the heat dissipator 20 with/from the rest of container 1 made of insulating material.

The protrusions 25, 25' of the heat dissipator 20 are configured, for example, to cooperate with respective projections 28, 28' provided on the remaining part of container 1. In the example in FIG. 3, a first projection 28 is arranged on the part or body 27 made of insulating material while a second projection 28' is provided on the part or body 29 made of insulating material.

According to another aspect of the invention, a possible button for interaction with the control unit is made of insulating material, forming part of container 1. In particular, a surface made of insulating material of the container 1 is thinned until becoming sufficiently flexible, so as to transfer an external pressure exerted on said thinned surface to an interaction button or command switch arranged within the container 1.

Thereby, gaskets and insulating means required to ensure the insulation of the internal components against water sprays are avoided from being used. The advantages deriving from the application of the present invention are clear:
 a radiator having the related control unit integral therewith, is allowed to be installed in an easier manner, while not suffering due to the heat radiated from the radiator,
 the use of forced ventilation to cool the electronic circuitry is avoided by exploiting the natural flow of cool air drawn by the radiator during its operation.

The invention is not limited to electric radiators, but may be employed in any type of radiator requiring the association with a control or measurement unit, and more in general with an electronic circuitry sensitive to increasing temperatures due to the radiator itself.

Figure 5:
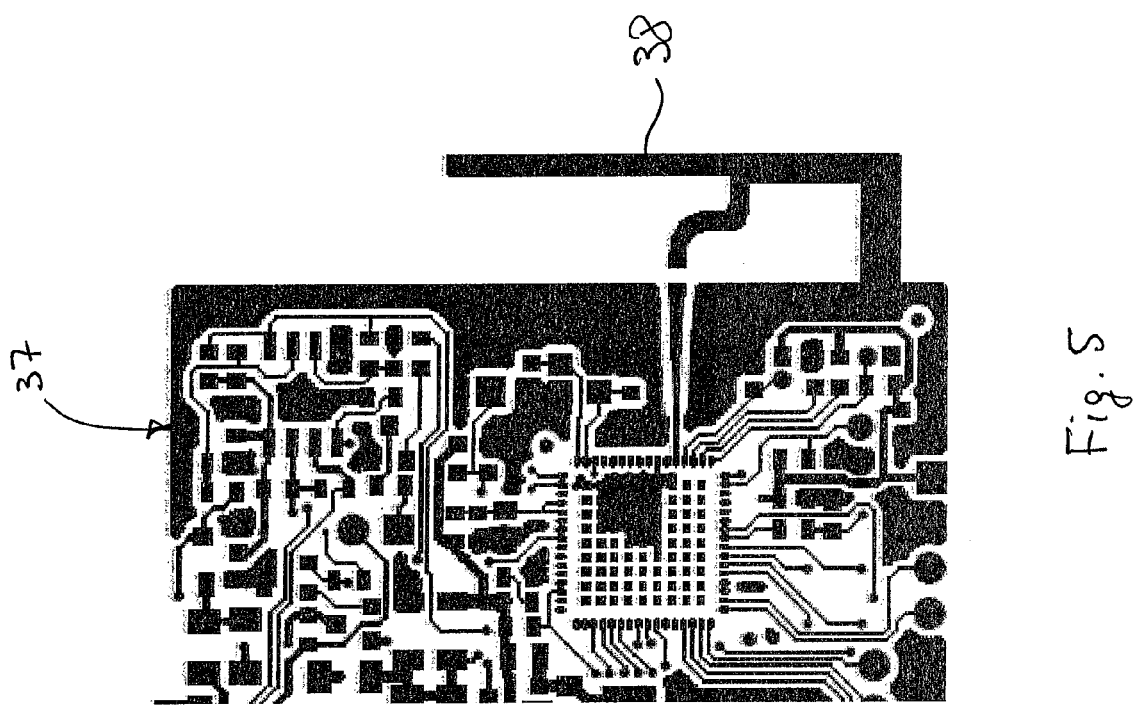
FIG. 5 shows a view of the electronic diagram of the control circuit of the radiator of the invention.

With particular reference to FIG. 5 where the electronic diagram of the control circuit 37 of radiator 2 contained in container 1 is shown, it is worth noting that the geometry of the receiving antenna 38 is configured so as to optimize the radiation diagram, as the same antenna is in an unfavourable position: it is in a lower position, behind the metal mass of the radiator 2, and sandwiched within the container 1 made of plastic with a significant metal part, i.e. the heat dissipator 20. The state of the art on these subjects explains how to construct antennas on 4-layer PCBs with a thickness of 0.8 mm, and the classic shape recommended in this frequency range (2.4 GHz) is named "F antenna". Specifically, following the standard instructions could result in a completely unusable solution as, in addition to the unfavourable position, the electronic circuit is made on 2-layer PCBs made of FR4 material and with a thickness of 1.6 mm: therefore, the features of the dielectric material change, which are essential in the electromagnetic domain. Therefore, the peculiarities of optimization consist in the shape of the antenna feed which is in the shape of a "horn" from the microcontroller to the (bypass) coupling condenser, and in the shape of "S" in the part adjacent to such a condenser. This geometry promotes the signal power transfer from the copper track to the air, thus avoiding reflections of the signal itself which prevent the emission into the air. The elements and features disclosed in the various preferred embodiments may be combined with one another without however departing from the scope of protection of the present application.

The invention claimed is:
1. A radiator for room heating, having a first radiating surface and a second radiating surface, opposite to the first surface, the radiator being configured to be fixed to a support wall, wherein the second radiating surface faces towards the support wall when the radiator is installed on said support wall and defines a rear surface of the radiator, said first radiating surface facing the room where the radiator is installed, said first surface and said second surface each having a surface area larger than a surface area of other surfaces of said radiator, the radiator comprising a container integrally fixed to the radiator and having a first wall proximal to the radiator and a second wall distal from the radiator and a control or measurement unit, accommodated in the container, wherein said container is arranged with the first wall facing towards and in superposition with the second radiating surface of the radiator, the first wall and the second radiating surface each being substantially parallel and spaced apart a predetermined distance from one another so as to form a passage for an ascending air flow generated by the operation of the radiator, the passage being sized and shaped to have a thickness defined by the predetermined distance, and a length and width defined by extent of the superposition of the first wall with the second radiating surface, with said passage being external to said control or measurement unit and open in directions transverse to the ascending air flow, wherein the length and width are both greater than the thickness to define a substantially flat air flow, said air flow brushing the container.

2. A radiator according to claim 1, wherein there is provided a manifold of a heating fluid provided with an external longitudinal groove for fixing support elements of the radiator to said support wall, said longitudinal groove being interrupted at a predetermined area for at least partially housing said container.

3. A radiator according to claim 2, wherein said passage for the ascending air flow at said predetermined area has a section which is larger than a passage section defined between the container and said rear surface of the radiator.

4. A radiator according to claim 3, wherein said predetermined area is at one end of the manifold of the radiator.

5. A radiator according to according to claim 1, wherein said container at least partially consists of a heat dissipator adapted to disperse heat generated by an internal circuitry of the control or measurement unit.

6. A radiator according to claim 5, wherein said heat dissipator contributes to forming a surface of the container configured to face the support wall when the radiator is installed on said support structure.

7. A radiator according to claim 5, wherein contact points of the container with the radiator are made of insulating material.

8. A radiator according to claim 5, wherein said heat dissipator is C-shaped and comprises three parts intended to at least partially cover or replace three sides of the container.

9. A radiator according to claim 3, wherein said predetermined area is between the support elements of the radiator.

* * * * *